United States Patent
Shirokaze

(10) Patent No.: US 9,510,476 B2
(45) Date of Patent: Nov. 29, 2016

(54) STANDARDIZATION OF SERVER MODULE IN HIGH-DENSITY SERVER

(71) Applicant: NEC Corporation, Minato-ku, Tokyo (JP)

(72) Inventor: Takayuki Shirokaze, Tokyo (JP)

(73) Assignee: NEC CORPORATION, Tokyo (JP)

( * ) Notice: Subject to any disclaimer, the term of this patent is extended or adjusted under 35 U.S.C. 154(b) by 227 days.

(21) Appl. No.: 13/868,217

(22) Filed: Apr. 23, 2013

(65) Prior Publication Data

US 2013/0279108 A1    Oct. 24, 2013

(30) Foreign Application Priority Data

Apr. 23, 2012 (JP) ................................. 2012-097739

(51) Int. Cl.
*H05K 7/14* (2006.01)
*G06F 1/18* (2006.01)

(52) U.S. Cl.
CPC ............. *H05K 7/1487* (2013.01); *G06F 1/181* (2013.01); *G06F 1/183* (2013.01); *G06F 1/185* (2013.01)

(58) Field of Classification Search
CPC ...... H05K 7/1487; G06F 1/183; G06F 1/185
USPC ............................................ 361/679.41, 788
See application file for complete search history.

(56) References Cited

U.S. PATENT DOCUMENTS

| | | | | |
|---|---|---|---|---|
| 5,926,378 | A * | 7/1999 | DeWitt | G06F 13/409 361/788 |
| 6,046,912 | A * | 4/2000 | Leman | 361/784 |
| 6,659,803 | B1 * | 12/2003 | Chen | 439/638 |
| 7,599,183 | B2 * | 10/2009 | Dittus | H05K 7/20727 361/695 |
| 2006/0242462 | A1 * | 10/2006 | Kasprzak | G06F 1/26 714/22 |
| 2012/0063080 | A1 * | 3/2012 | Chou | H05K 7/1487 361/679.6 |

FOREIGN PATENT DOCUMENTS

| | | |
|---|---|---|
| JP | 6-222857 A | 8/1994 |
| JP | 2002-175267 A | 6/2002 |
| JP | 2007-316722 A | 12/2007 |
| JP | 2008-282560 A | 11/2008 |

\* cited by examiner

*Primary Examiner* — Tuan T Dinh
*Assistant Examiner* — Rockshana Chowdhury

(57) ABSTRACT

A server includes a housing having a server-module storage space, a power source disposed in the rear side inside the housing, and a pair of server modules having horizontally symmetrical and vertically reversible shapes. When a pair of server modules is properly inserted into the housing of a server, they can receive electric power from the power source via connectors. Even when a pair of server modules is vertically reversed and inserted into the housing of a server, it is possible to secure electrical connection between the power source and the vertically reversed server modules. An erroneous insertion preventing measure is applied to the server-module storage space and a back panel fixed to a riser card, attached to each server module, so as to prevent erroneous insertion of server modules into the housing of a server. This may establish compatibility and standardization between server modules for use in servers.

6 Claims, 7 Drawing Sheets

STANDARDIZATION OF SERVER MODULE IN HIGH-DENSITY SERVER

BACKGROUND OF THE INVENTION

Field of the Invention

The present invention relates to a high-density server with a housing accommodating a plurality of server modules including motherboards and riser cards, and in particular to standardization of server modules demonstrating compatibility between them.

The present application claims priority on Japanese Patent Application No. 2012-97739, the entire content of which is incorporated herein by reference.

Description of the Related Art

Conventionally, computers have been categorized into clients and servers, wherein servers have been further developed into high-density servers with housing accommodating a plurality of sever modules including motherboards and riser cards. Additionally, various configurations and structures have been developed with respect to bus systems, circuit boards, connectors, and power supply units.

Patent Literature 1 discloses a bus hierarchy extension method for efficiently utilizing slots in a compact PCI bus system. It teaches an upper bus and a lower bus connected to a bridge substrate, wherein a pin alignment of a connector in the upper bus is determined in a 180-degree reverse manner to a pin alignment of a connector in the lower bus. Patent Literature 2 discloses a circuit board, e.g. an adaptor card with a male connector having a reversible connectivity to a female connector built in an extension slot. It teaches that a pair of a male connector and a female connector is disposed at opposite sides of an adaptor card. Patent Literature 3 discloses a connector device preventing easy detachment of connectors adapted to a game machine. It teaches that a connector device having a horizontal/vertical symmetrical shape is connectible to a connector receiver in a vertically-symmetrical manner. Patent Literature 4 discloses a notebook information processing device with a pair of connectors which allows a display unit to be reversely connected to a main body.

A conventional example of a high-density server is built with a housing accommodating a pair of server modules which are disposed in opposite areas interposing a power supply unit disposed at a center position. To prevent a pair of server modules from interfering with a power supply unit, each server module needs to be formed in an L-shape in plan view by partially cutting out one corner thereof. In the housing of a high-density server, a left-side sever module has a cutout at a right corner while a right-side server module has a cutout at a left corner. Patent Literatures 1 to 4 do not teach a high-density server with a housing accommodating a pair of server modules having different shapes.

In the above, a left-side server module and a right-side server module, having different shapes, are not compatible to each other; in other words, they are exclusively-designed products which need exclusively-designed parts in maintenance, causing troublesome management. Additionally, it is difficult to individually design and develop left-side and right-side server modules having different shapes. To solve this drawback, it may be necessary to develop standard shapes for server modules. However, when a pair of server modules having standard shapes is installed in a housing in a horizontally-reverse manner, riser cards (e.g. I/O cards) may be horizontally or vertically applied to server modules. When two or more I/O cards, each having a plurality of ports, are installed in server modules, for example, they may be erroneously connected to motherboards in server modules.

CITATION LIST

Patent Literature

Patent Literature 1: Japanese Patent Application Publication No. 2002-175267
Patent Literature 2: Japanese Patent Application Publication No. 2007-316722
Patent Literature 3: Japanese Patent Application Publication No. 2008-282560
Patent Literature 4: Japanese Patent Application Publication No. H06-222857

SUMMARY OF THE INVENTION

It is an object of the present invention to standardize server modules for use in a high-density server, allowing server modules, each having a standard shape, to be arranged in a horizontally or vertically reverse manner in a housing of a high-density server.

A first aspect of the present invention is directed to a server including a housing having a server-module storage space, a power source which is fixed at a center position in the rear side of the server-module storage space inside the housing, a pair of first and second server modules, having horizontally symmetrical shapes mounted on the server-module storage space, each of which includes a narrow portion, disposed along the lateral side of the power source, with a relatively small width and a wide portion, disposed in front of the power source and the narrow portion, with a relatively large width wider than the narrow portion, a pair of connecting units which is aligned in the front side of the power source, and a pair of secondary connecting units which is aligned along the rear sides of the wide portions of the first and second server modules horizontally joining together to oppositely face the power source. The power source supplies electric power to a pair of first and second server modules via a pair of connecting units and a pair of secondary connecting units when a pair of first and second server modules is collectively inserted into the housing so that a pair of connecting units is connected to a pair of secondary connecting units. The first and second server modules are each formed in a specific shape securing electrical connection between a pair of connecting units and a pair of secondary connecting units even when a pair of first and second server modules is vertically reversed and inserted into the housing.

A second aspect of the present invention is directed to a server module adapted to the housing of a server including a power source and a pair of connecting units in the rear side. The server module includes a narrow portion, which is disposed along the lateral side of the power source, with a relatively small width; and a wide portion, which disposed in front of the power source and the narrow portion, with a relatively large width wider than the narrow portion. The narrow portion and the wide portion are combined together to form a horizontally symmetrical and vertically reversible shape connectible to one of a pair of connecting units transmitting electric power from the power source.

A third aspect of the present invention is directed to a riser card having a pair of connecting parts each connectible to a riser-card connector of a server module. The server module is inserted into the housing of a server with a power source and a pair of connecting units in the rear side. The server module includes a narrow portion, disposed along the lateral side of the power source, with a relatively small width and a wide portion, disposed in front of the power source and the narrow portion, with a relatively large width wider than the narrow portion. The narrow portion and the wide portion are combined together to form a horizontally symmetrical and vertically reversible shape connectible to one of a pair of connecting units transmitting electric power from the power source. The riser-card connector is disposed at a center position of the narrow portion in a width direction.

The present invention may achieve various effects in design, development, and maintenance of servers each installing a plurality of server modules. For example, it is possible to reduce the number of parts stocked for maintenance and facilitate management of parts for use in servers. Additionally, it is possible to reduce time and labor in design and development, thus reducing development costs. Moreover, it is possible to establish compatibility and standardization between server modules in servers.

BRIEF DESCRIPTION OF THE DRAWINGS

These and other objects, aspects, and embodiments of the present invention will be described in more detail with reference to the following drawings.

DESCRIPTION OF THE PREFERRED EMBODIMENTS

The present invention will be described in further detail by way of examples with reference to the accompanying drawings.

1. First Embodiment

A first embodiment of the present invention, directing to a serve and a server module, will be described with reference to FIGS. 1 to 6.

Figure 1:
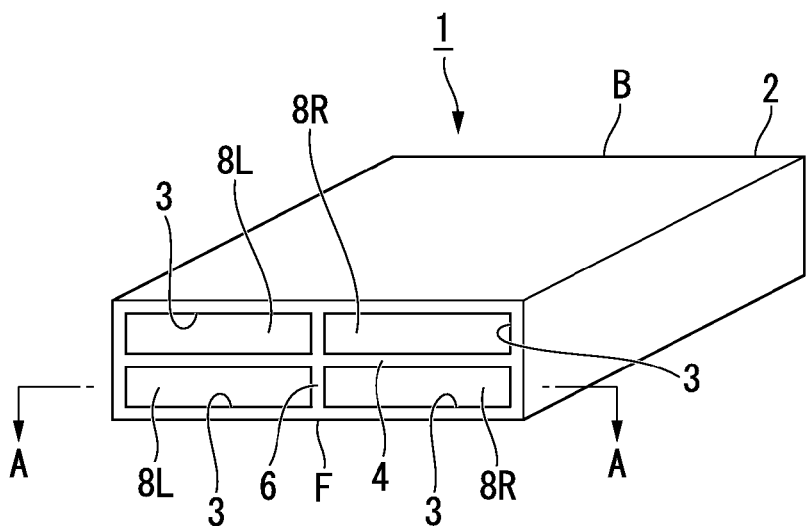
FIG. 1 is a perspective view of a server with housing accommodating a plurality of server modules according to a first embodiment of the present invention.

FIG. 1 is a perspective view of a server 1 with a front face F and a rear face B. The server 1 is encapsulated in a housing 2, having a rectangular parallelepiped shape, with four openings (or slots) 3 on a front face. The inside structure of the housing 2 is vertically partitioned into two serve module docks 5 (see FIG. 2) by way of a horizontal wall 4 which is arranged at a center position in a vertical direction. The front portion of each server-module storage space 5 is horizontally partitioned into two sections by way of a vertical wall 6 which is arranged at a center position in a width direction. Thus, each server-module storage space 5 provides two openings (or slots) 3 which are positioned adjacent to each other in a horizontal direction.

Figure 2:
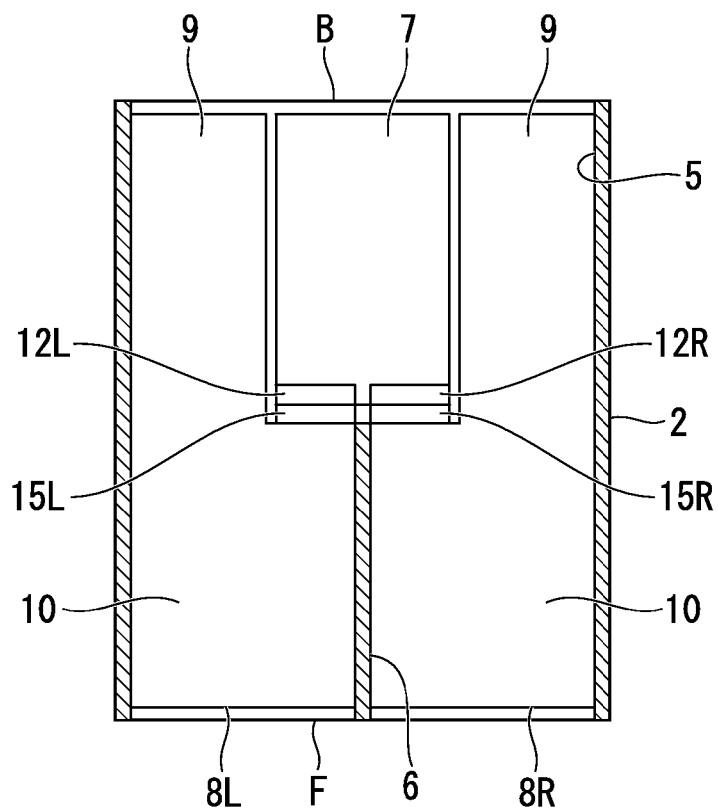
FIG. 2 is cross-sectional view taken along line A-A in FIG. 1.

FIG. 2 is a cross-sectional view taken along line A-A in FIG. 1. The server 1 includes two server-module storage spaces (i.e. upper and lower server-module storage spaces) 5 having the same internal structure. The following description will be given with respect to the internal structure of the lower server-module storage space 5 shown in FIG. 2, barring a description regarding internal structure of the upper server-module storage space 5.

A power source 7, having a rectangular parallelepiped shape, is fixed at a center position in the width of the rear portion of the server-module storage space 5. The server-module storage space 5 of the housing 2 is horizontally partitioned into two sections, which a left-side server module 8L and a right-side server module 8R are inserted into and connected to the power source 7.

Figure 3:
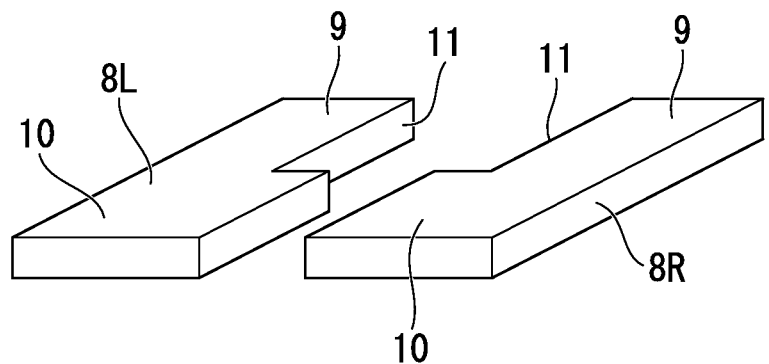
FIG. 3 is a perspective view illustrating a pair of server modules inserted into a server-module storage space inside the housing of the server.

FIG. 3 is a perspective view illustrating a pair of the left-side server module 8L and the right-side server module 8R with symmetrical shapes (e.g. L-shapes in plan view). The server modules 8L, 8R are mutually reversible because they can be placed upside down; hence, the left-side server module 8L corresponds to a vertical reversal of the right-side server module 8R.

Each of the server modules 8L, 8R has a narrow portion 9 and a wide portion 10, wherein the narrow portion 9 is disposed along a lateral side of the power source 7 while the wide portion 10 is disposed along a front side of the power source 7. Each of the server modules 8L, 8R having rectangular shapes is formed in an L-shape with a cutout in one corner of a rear side in plan view, wherein the server modules 8L, 8R do not physically interfere with the power source 7 when they are horizontally positioned adjacent to each other such that their cutouts will form a space for the power source 7. Specifically, the left-side server module 8L has a cutout at a right-rear corner while the right-side server module 8R has a cutout at a left-rear corner.

Figure 4:
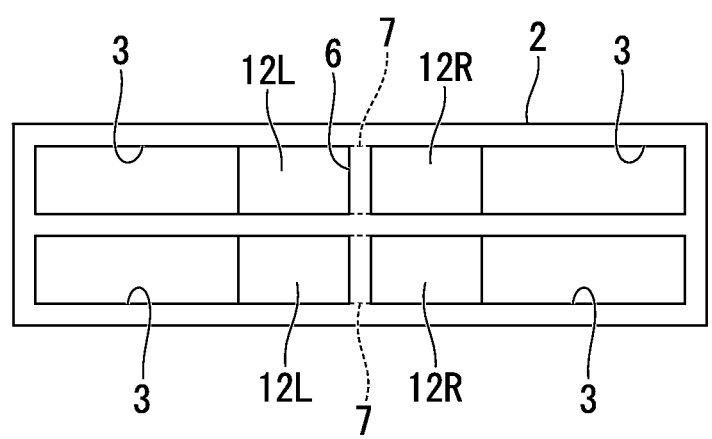
FIG. 4 is a front view of the housing of the server in which a power source having two connecting units is arranged in a rear side of a server-module storage space.

A single power source 7 is able to supply adequate power to the server modules 8L, 8R. As shown in FIG. 2, two connecting units 12L, 12R for the server modules 8L, 8R are positioned along the front face of the power source 7 in a horizontally symmetrical manner. Thus, the left-side server module 8L is electrically connected to the power source 7 via the connecting unit 12L while the right-side server module 8R is electrically connected to the power source 7 via the connecting unit 12R. FIG. 4 is a front view of the housing 2, which the sever modules 8L, 8R are inserted into. As shown in FIG. 4, the connecting units 12L, 12R attached to the power source 7 can be observed through the openings 3.

Figure 5:
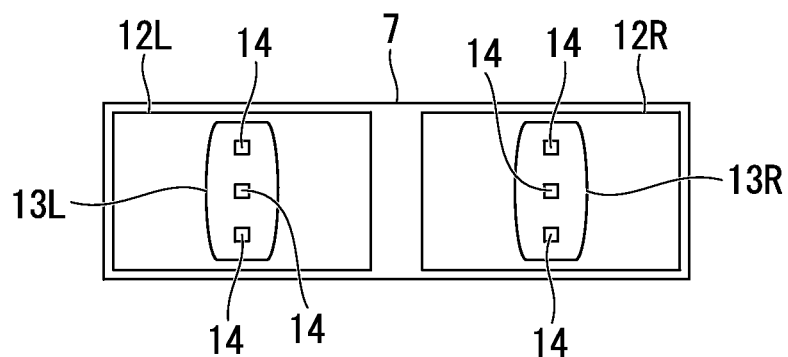
FIG. 5 is a front view of the power source with two connecting units having connectors which are shaped in a point-symmetrical manner.

FIG. 5 is a front view of the power source 7 with the connecting units 12L, 12R having female connectors 13L, 13R. The female connector 13L for the left-side server module 8L is attached to a center position of the connecting unit 12L in lateral and vertical directions, while the female connector 13R for the right-side server module 8R is attached to a center position of the connecting unit 12R in lateral and vertical directions. Thus, the female connectors 13L, 13R are symmetrically positioned in the front face of the power source 7. In other words, the female connectors 13L, 13R having the same shape and the same dimensions are each formed in a point-symmetrical shape. Additionally, each of the female connectors 13L, 13R includes a plurality of terminals 14 supplying electrical power and signals to the server modules 8L, 8R; specifically, each of the female connectors 13L, 13R includes three terminals 14 which are aligned in a point-symmetrical manner.

As shown in FIG. 2, a connecting unit 15L, attached to the rear side of the wide portion 10 of the left-side server module 8L, is positioned to face the connecting unit 12L of the power source 7, while a connecting unit 15R, attached to the rear side of the wide portion 10 of the right-side server module 8R, is positioned to face the connecting unit 12R of the power source 7. The connecting units 15L, 15R of the server modules 8L, 8R include male connectors (not shown), at center positions in lateral and vertical directions, which are connectible to the female connectors 12L, 12R of the power source 7. Similar to the female connectors 12L, 12R, the male connectors having the same shape and the same dimensions are each formed in a point-symmetrical shape. Additionally, each male connector includes a plurality of terminals which are aligned in a point-symmetrical manner.

The present embodiment allows the server modules 8L, 8R to be vertically reversed and horizontally changed in positioning when they are inserted into the openings 3 of the housing 2 of the server 1. In this case, the present embodiment secures electrical connection between the connecting unit 15L, 15R of the server modules 8L, 8R and the connecting units 12L, 12R of the power source 7; that is, the connecting unit 15L of the left-side server module 8L is reversely connectible to the connecting unit 12R of the power source 7 while the connecting unit 15R of the right-side server module 8R is reversely connectible to the connecting unit 15L of the power source 7.

In the server 1 having the above configuration, the rear side of the narrow portion 9 of the left-side server module 8L is inserted into the left-side opening 3 of the housing 2 so that a male connector of the connecting unit 15L is connected to the female connector 13L of the connecting unit 12L of the power source 7. The left-side server module 8L is vertically reversible to the right-side server module 8R; in other words, the left-side server module 8L reversed upside down may serve as the right-side server module 8R. Additionally, the rear side of the narrow portion 9 of the right-side server module 8R is inserted into the right-side opening 3 of the housing 2 so that a male connector of the connecting unit 15R is connected to the female connector 13R of the connecting unit 12R of the power source 7.

As described above, the server modules 8L, 8R are each formed in a reversible shape so that the connecting units 15L, 15R of the server modules 8L, 8R are reversibly connectible to the connecting units 12L, 12R of the power source 7 when they are vertically reversed and inserted into the openings 3 of the housing 2 in a horizontally reverse manner. Thus, the present embodiment may secure compatibility between the left-side server module 8L and the right-side server module 8R while standardizing the shaping of the server modules 8L, 8R. This may reduce the number of parts stocked for maintenance while alleviating a difficulty in managing parts. Additionally, it is possible to reduce time and labor in developing and designing server modules, thus reducing development costs.

Figure 6:
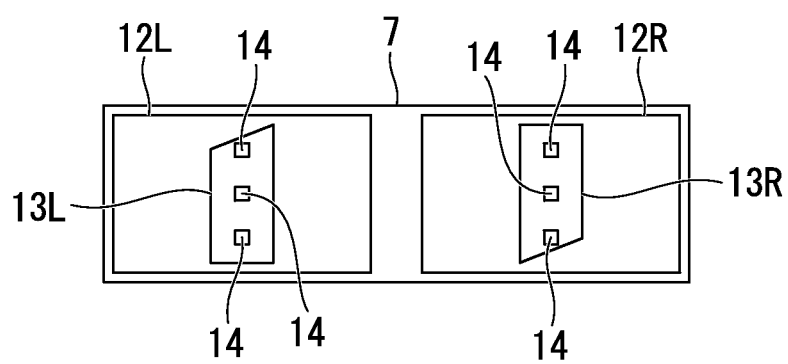
FIG. 6 is a front view of the power source with two connecting units having connectors which are shaped in a reverse-symmetrical manner.

The female connectors 13L, 13R of the connecting units 12L, 12R, attached to the power source 7, are not necessarily limited to point-symmetrical shapes. It is possible to modify the female connectors 13L, 13R as shown in FIG. 6, wherein the female connectors 13L, 13R are reversely symmetrical to each other. That is, when the female connector 13L is rotated by 180 degrees, the shape of the rotated female connector 13L matches with the shape of the other female connector 13R. In this case, the male connectors of the connecting units 15L, 15R, attached to the server modules 8L, 8R, need to be formed in a reversely symmetrical manner in conformity with the female connectors 13L, 13R shown in FIG. 6.

The first embodiment is designed such that a pair of server-module storage spaces 5 is vertically combined in the housing 2 of the server 1, wherein each serve module dock 5 has two openings 3 which are horizontally partitioned via the vertical wall 6; but this is not a restriction.

It is possible to redesign the server 1 to include a single server module 5, accommodating a pair of server modules 8L, 8R inserted therein, in the housing 2. In this case, the server-module storage space 5 may have two openings 3 which are formed horizontally adjacent to each other. Alternatively, the server-module storage space 5 may have a single opening 3 with an adequate size accommodating a plurality of sever modules on the front face of the housing 2. Additionally, the housing 2 may include three or more server-module storage spaces 5, each of which has an adequate size accommodating a pair of server modules inserted therein.

2. Second Embodiment

A second embodiment of the present invention will be described with reference to FIGS. 7, 8A and 8B. The second embodiment is designed basically similar to the first embodiment with respect to the configuration of the server 1 having the housing 2 accommodating a pair of server modules 8L, 8R inserted therein; hence, parts identical to those shown in FIGS. 1 to 6 are designated using the same reference signs, thus preventing the same descriptions from being repeated.

The second embodiment differs from the first embodiment in that the server modules 8L, 8R are equipped with riser-card connectors connectible to riser cards. It may be possible to install riser cards having I/O cards in server modules. In this case, however, when a server module equipped with riser cards having I/O cards is vertically reversed, the riser cards should be reversed in vertical and horizontal positions. When a server module with a plurality of I/O cards of the same type having a plurality of ports is vertically reversed so that I/O cards are reversed in horizontal and vertical positions, electronic devices may be erroneously connected to ports of I/O cards. The second embodiment is designed to implement an erroneous connection preventing measure, which will be described with reference to FIGS. 7, 8A and 8B.

Figure 7:
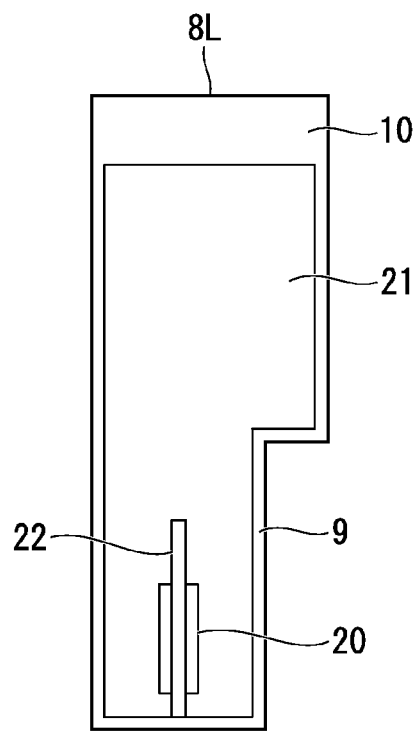
FIG. 7 is a plan view of a left-side server module for use in a server according to a second embodiment of the present invention.
Figure 8A:
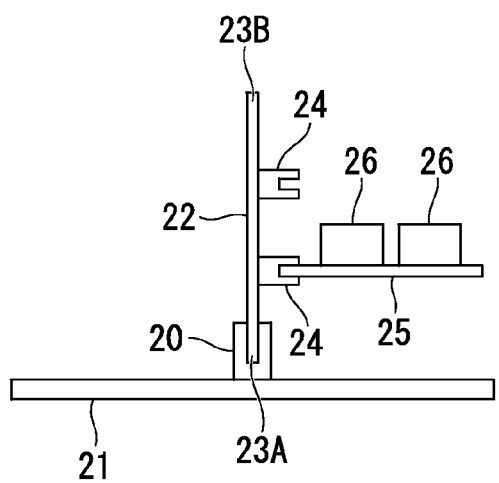
FIG. 8A is a rear view of the left-side server module.

FIG. 7 is a plan view of the left-side server module 8L of the second embodiment (which is partially modified compared to the left-side server module 8L of the first embodiment). The left-side server module 8L is equipped with a riser-card connector 20 which is mounted on a motherboard 21 and positioned at a center position of the narrow portion 9 in a horizontal direction. A riser card 22 is connected to the riser-card connector 20 as shown in FIGS. 7 and 8A. FIG. 7 shows that a longitudinal direction of the riser card 22 matches with a front-rear direction of the housing 2, while FIG. 8A shows that the riser card 22 is vertically disposed at a right angle on the motherboard 21.

A pair of connecting parts 23A, 23B, each connectible to the riser-card connector 20, is formed at the upper and lower ends of the riser card 22. FIG. 8A shows that the lower connecting part 23A of the riser card 22 is connected to the riser-card connector 20, wherein the riser card 22 is equipped with a plurality of connectors (e.g. two connectors) 24 connectible to I/O cards on the right side. An I/O card (or an extension board) 25 with a plurality of ports (e.g. two ports) 26 is connected to the connector 24 of the riser card 22. FIG. 8A shows that the I/O card is connected to the lower connector 24 of the riser card 22, but it is possible to connect another I/O card 25 to the upper connector 24 of the riser card 22.

Figure 8B:
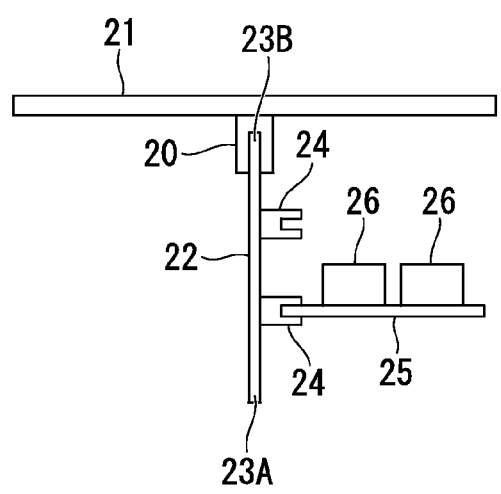
FIG. 8B is a rear view of a right-side server module, which is placed horizontally adjacent to the left-side server module in the housing of the server.

As shown in FIG. 8B, the right-side server module 8R is formed in a vertically reversed shape compared to the shape of the left-side sever module 8L. Similar to the left-side server module 8L, the right-side server module 8R is equipped with the riser-card connector 20 which is attached to the motherboard 21 at a center position of the narrow portion 9 in a horizontal direction. Compared to the riser-card connector 20 of the left-side server module 8L which is directed upwardly, the riser-card connector 20 of the right-side server module 8R is reversed and directed downwardly. Thus, the upper connecting part 23B of the riser card 22 needs to be connected to the riser-card connector 20 of the right-side server module 8R. The right-side server module 8R of FIG. 8B is vertically reverse to the left-side server module 8L of FIG. 8A, but the right-side server module 8R allows the riser card 22 to arrange the connectors 24 on the right side.

The second embodiment is designed to standardize the shapes of the server modules 8L, 8R for use in the server 1. That is, the left-side server module 8L (precluding the riser card 22 and the I/O card 25 in FIG. 8A) with the motherboard 21 at a lower position is vertically reversed to simply realize the right-side server module 8R (precluding the riser card 22 and the I/O card 25 in FIG. 8B) with the motherboard 21 at an upper position. Vertically reversing the left-side server module 8L allows the riser-card connector 22, which is directed downwardly, to be connected to the upper connecting part 23B of the riser card 22, thus realizing the right-side server module 8R shown in FIG. 8B.

Thus, the lower connecting part 23A of the riser card 22 is connectible to the riser-card connector 20 of the left-side server module 8L, which is directed upwardly, while the upper connecting part 23B of the riser card 22 is connectible to the riser-card connector 20 of the right-side server module 8R, which is directed downwardly. This prevents the riser card 22 from being vertically reversed so that the top and bottom of the riser card 22 will not be reversed in positioning. As shown in FIGS. 8A, 8B, both the server modules 8L, 8R allow the riser card 22 to be equipped with the connectors 24 (connectible to the I/O cards 25) on the right side in a rear view. This reliably prevents cables (not shown) from being erroneously connected to the ports 26 of the I/O cards 25 which are connected to the riser card 22.

The second embodiment is designed similar to the first embodiment in such a way that the server modules 8L, 8R can be vertically reversed and inserted into the horizontally different openings 3 of the housing 2 while securing electrical connection between the connecting units 15L, 15R and the connecting units 12L, 12R of the power source 7. Thus, the second embodiment may realize compatibility between the server modules 8L, 8R; in other words, the second embodiment may standardize the shapes of the server modules 8L, 8R.

The second embodiment is characterized in that the riser-card connectors 20 connectible to the riser cards 22 are attached to the narrow portions 9 of the server modules 8L, 8R, wherein each riser card 22 has a pair of connecting parts 23A, 23B, each connectible to the riser-card connector 20, at the upper and lower ends. Thus, it is possible to prevent the I/O cards 25 from being erroneously connected to the riser cards 22, and it is possible to prevent cables (not shown) from being erroneously connected to the ports 26 of the I/O cards 25.

3. Third Embodiment

A third embodiment of the present invention will be described with reference to FIGS. 9, 10, 11A and 11B. The third embodiment is designed basically similar to the second embodiment with respect to the configuration of the server 1 having the housing 2 accommodating a pair of server modules 8L, 8R inserted therein; hence, parts identical to those shown in FIGS. 1 to 6 as well as FIGS. 7, 8A and 8B are designated using the same reference signs, preventing the same descriptions from being repeated.

The third embodiment differs from the second embodiment by implementing an erroneous insertion preventing measure which prevents the server modules 8L, 8R from being inserted into the housing 2 when the riser cards 22 are not properly connected to the riser-card connectors 20 of the server modules 8L, 8R. The erroneous insertion preventing measure of the third embodiment will be described with reference to FIGS. 9, 10, 11A and 11B.

Figure 9:
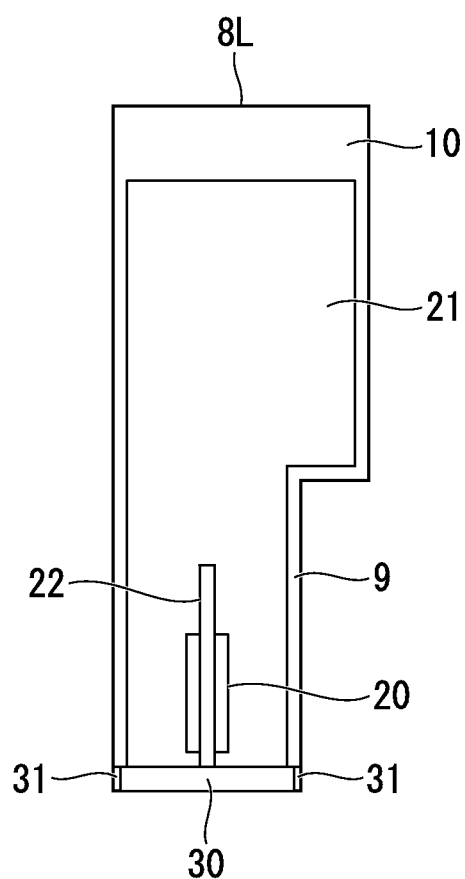
FIG. 9 is a plan view of a left-side server module for use in a server according to a third embodiment of the present invention.
Figure 11A:
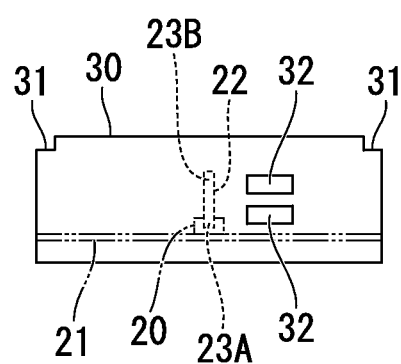
FIG. 11A is a rear view of the left-side server module with a riser card having a back panel.
Figure 11B:
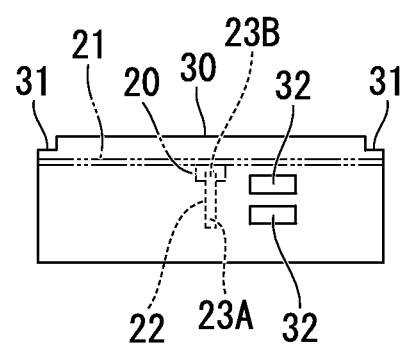
FIG. 11B is a rear view of a right-side server module, which is placed horizontally adjacent to the left-side server module, with a riser card having a back panel.

FIG. 9 is a plan view of the left-side server module 8L of the third embodiment (which is partially modified compared to the left-side server module 8L of the second embodiment), which is equipped with a back panel 30 in the rear side. The back panel 30 is fixed to the rear end of the riser card 22 and integrally formed with the riser card 22. When the riser card 22 is disconnected from the riser-card connector 20 and removed from the left-side server module 8L, the back panel 30 is removed from the riser card 22. FIGS. 11A and 11B are rear views showing the back panels 30 for use in the server modules 8L, 8R, wherein the riser card 22 is attached to the back panel 30 at a center position in a horizontal direction and in a vertical direction. A pair of cutouts 31 is formed at left and right corners of an upper end of the back panel 30. A plurality of holes 32 (e.g. two holes 32) exposing the ports of the I/O card 25 is vertically aligned and formed in the back panel 30.

The lower connecting part 23A of the riser card 22 is connected to the "upwardly directed" riser-card connector 20 of the left-side server module 8L with the motherboard 21 at a lower position. When the riser card 22 unified with the back panel 30 of FIG. 11A is properly connected to the riser-card connector 20 of the left-side server module 8L, a pair of cutouts 31 is positioned on the upper end of the back panel 30. As described in the second embodiment, the left-side server module 8L can be vertically reversed to realize the right-side server module 8R with the "downwardly directed" riser-card connector 20. The upper connecting part 23B of the riser card 22 is connected to the "downwardly directed" riser-card connector 20 of the right-side server module 8R with the motherboard 21 at an upper position. When the riser card 22 unified with the back panel 30 of FIG. 11B is properly connected to the riser-card connector 20 of the right-side server module 8L, a pair of cutouts 31 is positioned on the upper end of the back panel 30.

Figure 10:
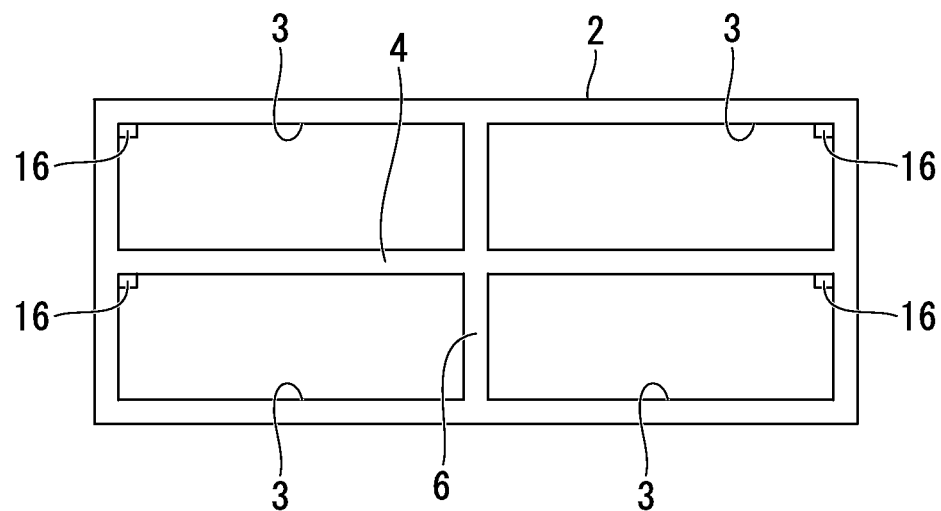
FIG. 10 is a front view of a housing of the server of the third embodiment.

FIG. 10 is a front view of the housing 2 of the server 1 according to the third embodiment, wherein a projection 16 is attached to the upper-left corner of the left-side opening 3 while another projection 16 is attached to the upper-right corner of the right-side opening 3 on the front face of the housing 2. The size of the projection 16 is smaller than the size of the cutout 31; this allows the projection 16 to smoothly move inside the cutout 31. A pair of the projection 16 and the cutout 31 forms an erroneous insertion preventing measure.

When the left-side server module 8L with the "upwardly directed" riser-card connector 20 properly connected to the riser card 22 is inserted into the left-side opening 3 of the housing 2, for example, the projection 16 at the upper-left corner of the left-side opening 3 may smoothly pass through the cutout 31 at the upper-left corner of the back panel 30 of FIG. 11A attached to the riser card 22. This allows the left-side server module 8L to be smoothly placed on the left-side server-module storage space 5 inside the left-side opening 3 of the housing 2.

When the right-side server module 8R with "downwardly directed" the riser-card connector 20 properly connected to the riser card 22 is inserted into the right-side opening 3 of the housing 2, the projection 16 at the upper-right corner of the right-side opening 3 may smoothly pass through the cutout 31 at the upper-right corner of the back panel 30 of FIG. 11B attached to the riser card 22. This allows the right-side server module 8R to be smoothly inserted into the right-side opening 3 of the housing 2 and properly placed on the server-module storage space 5.

By mistake, the left-side server module 8L with the "upwardly directed" riser-card connector 20 connected to the lower connecting part 23A of the riser card 22 shown in FIG. 11A can be vertically reversed to realize the right-side server module 8R. When the vertically reversed left-side server module 8L serving as the right-side server module 8R is inserted into the right-side opening 3 of the housing 2, no cutouts 31 are formed on the upper end of the vertically reversed back panel 30 due to vertical reversal of the riser card 22 having the back panel 30 of FIG. 11A. Thus, the upper-right projection 16 of the right-side opening 3 may collide with the upper-right corner of the vertically reversed back panel 30 having no cutout 31; this may reliably prevent the vertically reversed left-side server module 8L serving as the right-side server module 8R from being erroneously inserted into the right-side opening 3 of the housing 2.

The third embodiment is designed similar to the first and second embodiments in such a way that the server modules 8L, 8R can be vertically reversed and inserted into the horizontally different openings 3 of the housing 2 while securing electrical connection between the connecting units 15L, 15R and the connecting units 12L, 12R of the power source 7. Thus, the third embodiment may realize compatibility between the server modules 8L, 8R; in other words, the third embodiment may standardize the shapes of the server modules 8L, 8R.

According to the third embodiment similar to the second embodiment, the riser-card connectors 20 connectible to the riser cards 22 are attached to the narrow portions 9 of the server modules 8L, 8R, wherein each riser card 22 has a pair of connecting parts 23A, 23B, each connectible to the riser-card connector 20, at the upper and lower ends. Thus, it is possible to prevent the I/O cards 25 from being erroneously connected to the riser cards 22, and it is possible to prevent cables (not shown) from being erroneously connected to the ports 26 of the I/O cards 25.

Additionally, the server 1 of the third embodiment implements an erroneous insertion preventing measure, which may reliably prevents the server module 8L or 8R with the riser-card connector 20 improperly connected to the riser card 22 from being inserted into the opening 3 of the housing 2.

In this connection, the shape and position of the projection 16, formed in the opening 3 of the housing 2, and the shape and position of the cutout 31, formed in the back panel 30, are not necessarily limited the foregoing ones. It is possible to arbitrarily determine the shape and position regarding the projection 16 and the back panel 30 as long as they can prevent erroneous insertion of the server module 8L or 8R into the opening 3 of the housing 2. For example, it is possible to form the projection 16, not on the front face of the housing 2 but at an inner position inside the front face of the housing 2 by a predetermined distance. Alternatively, it is possible to arbitrary determine the positions of the projection 16 and the cutout 31 other than the corner of the opening 3 and the corner of the back panel 30.

4. Fourth Embodiment

Figure 12:
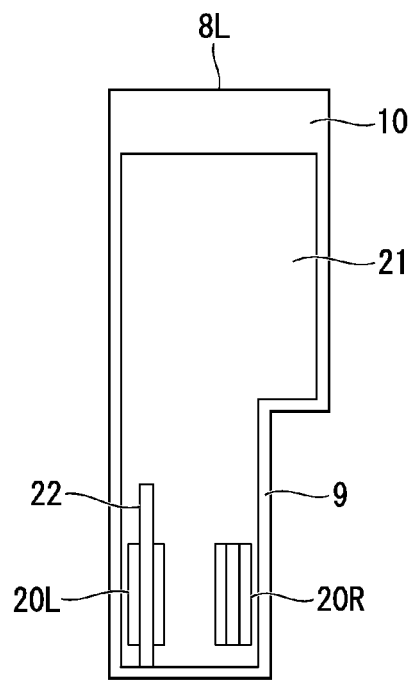
FIG. 12 is a plan view of a left-side server module for use in a server according to a fourth embodiment of the present invention.

A fourth embodiment of the present invention will be described with reference to FIGS. 12, 13A and 13B. The fourth embodiment is designed basically similar to the second embodiment with respect to the configuration of the server 1 having the housing 2 accommodating a pair of server modules 8L, 8R inserted therein; hence, parts identical to those shown in FIGS. 1 to 7, 8A and 8B are designated using the same reference signs, preventing the same descriptions from being repeated.

The fourth embodiment differs from the second embodiment in that each of the server modules 8L, 8R is equipped with a pair of riser-card connectors 20L, 20R. FIG. 12 is a plan view of the left-side server module 8L in which a pair of riser-card connectors 20L, 20R is mounted on the narrow portion 9 of the motherboard 21. The riser-card connectors 20L, 20R are attached to horizontally symmetrical positions in proximity to the left and right sides of the narrow portion 9. In the fourth embodiment, the riser card 22 has a pair of connecting parts 23A, 23B connectible to the riser-card connectors 20L, 20R.

Similar to the foregoing embodiments, the fourth embodiment is designed such that the left-side server module 8L is vertically reversed to realize the right-side server module 8R, wherein the riser-card connectors 20L, 20R are vertically and horizontally changed in position, thus allowing for insertion of the riser card 22.

Figure 13A:
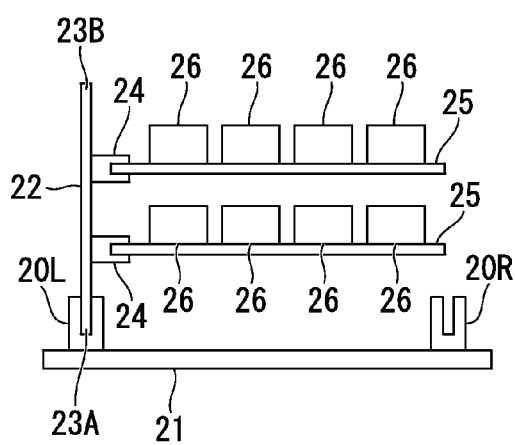
FIG. 13A is a rear view of the left-side server module.
Figure 13B:
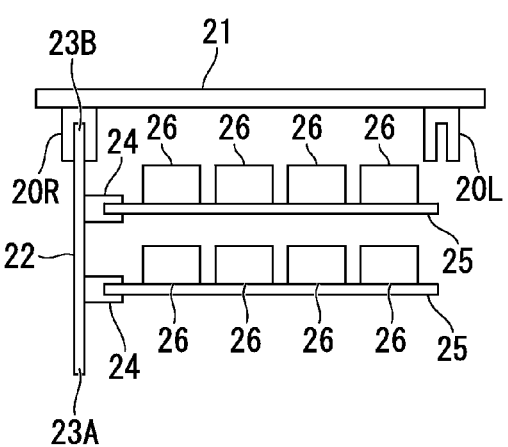
FIG. 13B is a rear view of a right-side server module, which is placed horizontally adjacent to the left-side server module in a housing of the server.

FIG. 13A is a rear view of the left-side server module 8L in view of the narrow portion 9, while FIG. 13B is a rear view of the right-side server module 8R in view of the narrow portion 9. The left-side server module 8L of FIG.

13A is equipped with a pair of riser-card connectors 20L, 20R which are directed upwardly, wherein the lower connecting part 23A of the riser card 22 is connected to the left-side riser-card connector 20L. This allows the connectors 24, connectible to the I/O cards 25, to be arranged on the right side of the riser card 22 in a rear view of FIG. 13A. The right-side server module 8R of FIG. 13B is equipped with a pair of riser-card connectors 20L, 20R which are directed downwardly, wherein the upper connecting part 23B of the riser card 22 is connected to the right-side riser-card connector 20R. This allows the connectors 24, connectible to the I/O cards 25, to be arranged on the right side of the riser card 22 in a rear view of FIG. 13B.

As described above, the lower connecting part 23A of the riser card 22 is connected to the "upwardly directed" riser-card connector 20L of the left-side server module 8L, while the upper connecting part 23B of the riser card 22 is connected to the "downwardly directed" riser-card connector 20R of the right-side server module 8R; this prevents the riser card 22 from being vertically reversed in usage. Additionally, this allows the connectors 24, connectible to the I/O cards 25, to be arranged on the right side of the riser card 22 in a rear view in both the left-side server module 8L and the right-side server module 8R as shown in FIGS. 13A and 13B. Similar to the second embodiment, it is possible to prevent the I/O cards 25 from being erroneously connected to the riser cards 22, and it is possible to prevent cables (not shown) from being erroneously connected to the ports 26 of the I/O cards 25. Furthermore, the narrow portions 9 of the server modules 8L, 8R having relatively small widths may allow for installation of the I/O cards 25 having relatively large widths.

The fourth embodiment is designed similar to the first embodiment in such a way that the server modules 8L, 8R can be vertically reversed and inserted into the horizontally different openings 3 of the housing 2 while securing electrical connection between the connecting units 15L, 15R and the connecting units 12L, 12R of the power source 7. Thus, the second embodiment may realize compatibility between the server modules 8L, 8R; in other words, the second embodiment may standardize the shapes of the server modules 8L, 8R.

Additionally, the fourth embodiment is designed such that a pair of riser-card connectors 20L, 20R is attached to horizontally symmetrical positions in the narrow portion 9 in each of the server modules 8L, 8R, wherein each riser card 22 has a pair of connecting parts 23A, 23B, connectible to the riser-card connectors 20L, 20R, at the upper and lower ends. Thus, it is possible to prevent the I/O cards 25 from being erroneously connected to the riser cards 22, and it is possible to prevent cables (not shown) from being erroneously connected to the ports 26 of the I/O cards 25.

As described above, the present invention can be summarized with an illustration of FIG. 2, as follows.

The server 1 includes the housing 2, the power source 7, and a pair of server modules 8L, 8R having horizontally symmetrical shapes. The power source 7 is fixed at a center position in the rear side inside of the housing 2 in the width direction. A pair of server modules 8L, 8R is inserted into a pair of slots (or opening) 3 of the housing 2. Each of the server modules 8L, 8R includes the narrow portion 9, which is arranged along the lateral side of the power source 7, with a relatively small width, and the wide portion 10, which is arranged in the front of the power source 7 and the narrow portion 9, with a relatively large width wider than the width of the narrow portion 9. A pair of connecting units 12L, 12R for supplying electric power of the power source 7 to a pair of server modules 8L, 8R is aligned on the front side of the power source 7, while a pair of connecting units 15L, 15R, connectible to a pair of connecting units 12L, 12R, is aligned on the rear sides of the wide portions 10 of the server modules 8L, 8R, which horizontally join together, to oppositely face a pair of connecting units 12L, 12R attached to the front side of the power source 7. Even when a pair of server modules 8L, 8R is vertically reversed and inserted into the opposite openings 3 of the housing 2, it is possible to secure electrical connection between the connecting units 12L, 12R and the connecting units 15L, 15R, in other words, it is possible secure electrical connection between the power source 7 and the server modules 8L, 8R via the connecting units 12L, 12R and the connecting units 15L, 15R.

As described above, the server modules 8L, 8R are each formed in an appropriate shape to secure electrical connection with the power source 7 even when they are vertically reversed and inserted into the opposite openings 3 of the housing 2. Thus, it is possible to establish compatibility between the server modules 8L, 8R, and it is possible to standardize the shapes of the server modules 8L, 8R. This may reduce the number of parts stocked for maintenance and facilitate management of parts for use in servers. Additionally, it is possible to reduce time and labor in design and development, thus reducing development costs.

Lastly, the present invention is not necessarily limited to the foregoing embodiments, which can be further modified in various ways within the scope of the invention as defined in the appended claims.

What is claimed is:
1. A server comprising:
a housing having a server module storage space which is horizontally partitioned into a pair of openings via a vertical wall, which is formed at a front-center position and extended in a longitudinal direction inside the housing;
a power source fixed at a rear-center position, adjacent to the vertical wall having a predetermined length, in a rear side inside the housing;
a pair of first and second server modules, each of which is inserted into the pair of openings inside the housing, wherein the first server module having a substantially L-shape and the second server module is a mirror image of the first server module, each of the first and the second server modules including a narrow portion and a wide portion, wherein the wide portion is horizontally wider than the narrow portion, wherein the wide portion is followed by the narrow portion disposed along a length of the power source, and wherein a difference between the wide portion and the narrow portion in the pair of first and second server modules is disposed along a front side of the power source when the pair of first and second server modules is inserted into the pair of openings inside the housing;
a pair of first connecting units aligned in connection with the front side of the power source; and
a pair of secondary connecting units being coupled with the pair of first connecting units in connection with the pair of first and second server modules,
wherein the power source supplies electric power to the pair of first and second server modules via an electrical connection established between the pair of first connecting units and the pair of secondary connecting units even when the pair of first and second server modules is vertically reversed and inserted into the pair of openings inside the housing.

2. The server according to claim 1, wherein the pair of first connecting units has a pair of connectors each including a plurality of terminals being vertically and symmetrically aligned together.

3. The server according to claim 1, further comprising a riser-card connector which is disposed at a predetermined position on the narrow portion and extended in the longitudinal direction in each of the first and second server modules, and wherein the riser-card connector vertically supports a riser card having a pair of connecting parts, each connectible to the riser-card connector at upper and lower ends thereof.

4. The server according to claim 3, further comprising a back panel connected to a rear end of the narrow portion in each of the first and second server modules, wherein the riser card is integrally fixed to the back panel, and wherein an erroneous insertion preventing measure for preventing erroneous insertion of the pair of first and second server modules into the pair of openings is applied to the back panel and the server module storage area of the housing.

5. The server according to claim 4, wherein the erroneous insertion preventing measure includes a pair of cutouts formed at opposite corners of the back panel and a pair of projections formed at opposite corners of the server module storage space of the housing, and wherein the pair of cutouts engages with the pair of projections when the pair of first and second server modules is inserted into the pair of openings.

6. A server comprising:
a housing having a server module storage space which is horizontally partitioned into a pair of openings via a vertical wall, which is formed at a front-center position and extended in a longitudinal direction inside the housing;
a first server module disposed inside the housing;
a second server module, corresponding to vertical reversal of the first server module, which is disposed inside the housing by the side of the first server module, the first server module and the second server modules being inserted into the pair of openings;
a first connecting unit configured to install the first server module and a second connecting unit configured to install the second server module inside the housing; and
a power source, adjacent to the vertical wall, having the first connecting unit and the second connecting unit, which is interposed between the first server module and the second server module, wherein:
the first server module has a first server module connector positioned opposite to the first connecting unit,
the second server module has a second server module connector positioned opposite to the second connecting unit;
the first connecting unit and the second connecting unit as well as the first server module connector and the second server module connector are shaped to allow the first server module being vertically reversed to be connected to the second connecting unit while allowing the second server module being vertically reversed to be connected to the first connecting unit;
the first server module having a substantially L-shape and the second server module is a mirror image of the first server module, each of the first and the second server modules including a narrow portion and a wide portion; and
the wide portion is horizontally wider than the narrow portion, wherein the wide portion is followed by the narrow portion disposed along a length of the power source;
the first connecting unit and the second connecting unit are electrically connectable to the first server module connector and the second server module connector;
a difference between the wide portion and the narrow portion in the pair of first and second server modules is disposed along a front side of the power source when the pair of first and second server modules is inserted into the pair of openings inside the housing.

* * * * *